(12) United States Patent
Gilles (10) Patent No.: US 10,268,625 B2
(45) Date of Patent: Apr. 23, 2019

(54) SIGNAL PATH VERIFICATION DEVICE

(71) Applicant: dSPACE digital signal processing and control engineering GmbH, Paderborn (DE)

(72) Inventor: Rafael Gilles, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 509 days.

(21) Appl. No.: 14/996,281

(22) Filed: Jan. 15, 2016

(65) Prior Publication Data
US 2017/0206097 A1  Jul. 20, 2017

(51) Int. Cl.
G06F 13/12 (2006.01)
G06F 13/42 (2006.01)
G06F 17/50 (2006.01)

(52) U.S. Cl.
CPC ...... *G06F 13/4221* (2013.01); *G06F 17/5027* (2013.01)

(58) Field of Classification Search
CPC ... G06F 8/34; G06F 8/41; G06F 8/443; G06F 8/4436; G06F 17/5009
USPC .......................................... 710/104
See application file for complete search history.

(56) References Cited

U.S. PATENT DOCUMENTS

| | | | | |
|---|---|---|---|---|
| 2003/0132962 A1* | 7/2003 | Santori | ................... | G06F 9/451 715/762 |
| 2004/0230944 A1* | 11/2004 | Murphy | ............. | G05B 19/0426 717/105 |
| 2008/0077382 A1* | 3/2008 | Strehl | ................ | G06F 17/5022 703/20 |
| 2012/0272209 A1* | 10/2012 | Biglari | ..................... | G06F 8/30 717/105 |

(Continued)

FOREIGN PATENT DOCUMENTS

DE   10 2009 034 242 A1   1/2011

OTHER PUBLICATIONS

"NI-DAQmx Simulated Devices", www.ni.com, pags. 1-7 (Dec. 18, 2013).

(Continued)

*Primary Examiner* — Titus Wong
(74) *Attorney, Agent, or Firm* — Muncy, Geissler, Olds & Lowe, P.C.

(57) ABSTRACT

An input/output interface of a test device is configured, wherein the input/output interface is developed for connecting a hardware unit to a behavioral model present in the test device. The method includes the steps of: displaying a graphical representation of the input/output interface as a signal path between a hardware port for connection of the hardware and at least one model port for connecting the behavioral model via a selectable input/output function; receiving a first configuration for the signal path; receiving a test value that is predefinable at the hardware port or the (Continued)

model port of the signal path, but, for example, is also predefinable through the graphical representation of the hardware port or the model port; propagating a test signal associated with the test value along the signal path according to the first configuration for the signal path, and displaying the propagated test signal on the graphical representation of the model port or the hardware port.

17 Claims, 3 Drawing Sheets

(56) References Cited

U.S. PATENT DOCUMENTS

2013/0338801 A1* 12/2013 Grosse ............... G05B 19/0426
            700/80
2015/0134317 A1   5/2015 Maturana et al.

OTHER PUBLICATIONS

Extended European Search Report for European Application No. 16151449.2 dated Jun. 28, 2016 with English translation.

* cited by examiner

SIGNAL PATH VERIFICATION DEVICE

BACKGROUND OF THE INVENTION

Field of the Invention

The present invention relates to the development of control units, such as are used in the automotive industry or in the aviation industry, for example, for controlling technical systems such as, e.g., engines or brakes. In particular, the present invention concerns testers that are used in the development process for control units.

Description of the Background Art

The development of control units has become a highly complex process. New control units and new control functions should thus be tested as early in the development process as possible in order to verify general functionality and to set the direction for further development. Towards the end of the development process, it is important to test the control unit, which has already undergone extensive development, as comprehensively as possible in order to make necessary modifications based on the test results before the control unit comes into use or enters mass production, so that it functions as desired under all conditions in later operation.

Two exemplary steps of the development process in which testers are used for testing the control unit are described below. So-called hardware-in-the-loop simulators (HIL simulators) are employed at a fairly late stage of the development process. Such HIL simulators contain a model of the technical system to be controlled and/or regulated, with the model being present in software. The HIL simulator also contains an electrical input/output interface to which it is possible to connect the control unit, which has already undergone extensive development and is physically present as hardware. The functionality of the control unit can now be tested in various simulation passes, wherein it is possible to observe how the model of the technical system to be controlled reacts to the signals of the control unit, and how the control unit reacts to the events predefined by the model of the technical system to be controlled. In this process, it is possible to simulate not only normal operation, but also faults in the technical system to be controlled as well as faults in the control unit.

Rapid control prototyping (RCP) is a development step that takes place closer to the start of the development process. In RCP, the tester is used on the control unit side. In other words, in rapid control prototyping the tester takes on the role of a prototype of the control unit that is being developed. The tester contains a model of the control unit to be tested. Because of the early stage of development, the model of the control unit to be tested is oftentimes still fairly rudimentary in comparison to the later, final control unit. However, in some cases the model can also be very close in technical terms to the final control unit, or even largely identical thereto with regard to the software. Often, no hardware implementation of the control unit is yet in existence; instead, the model of the control unit to be tested that is present in the tester is a software model. The tester can be connected through an input/output interface to the technical system to be controlled itself, or to the control unit that exists to date for the technical system to be controlled. In the first case, there is a direct connection between the control unit to be tested, in the form of a software model, and the technical system to be controlled, which is physically present. In the second case, the control unit that exists to date is the technical system to be controlled by the RCP tester. This control of the control unit that exists to date results in a modification of the control method of the control unit that exists to date, making it possible to test new control functionality by means of the externally connected RCP tester, an arrangement that is also referred to as bypassing.

In both examples cited (HIL simulator and RCP tester), there is a tester in which a software model is present that represents the behavior of a technical system or the behavior of the control unit, and consequently is referred to hereinafter as a behavioral model. This behavioral model can be connected to an external device through the input/output interface so that tests can be carried out. In the case of RCP, the tester contains a behavioral model of the control unit to be tested, and is connected to the technical system to be controlled, for example an engine/motor vehicle. In the case of HIL, the tester contains a behavioral model of the technical system to be controlled, for example an engine model, and is connected to the control unit to be tested.

As already indicated, the tester has an input/output interface through which the tester is connected to the technical system to be controlled or to the control unit to be tested, depending on the application case. This input/output interface is connected in the tester to the behavioral model present in the tester so that the behavioral model can communicate with the applicable hardware through the input/output interface. The tester has a plurality of input/output functions for this connection of the behavioral model with the input/output interface. These input/output functions constitute the connecting link between the behavioral model on one side and the physically present input/output interface on the other side. One and the same tester can be used for different simulations. In other words, one and the same tester can be used with different behavioral models present in the tester and with different hardware to be tested that is connected to the tester. It is evident that different channels of the input/output interface and different input/output functions are required for different connected devices/systems and for different behavioral models.

Since a plurality of connections are involved and it is necessary to define properties for the input/output signals for each of these connections, it is desirable to be able to verify the creation of the connection after an initial configuration of the signal paths between the hardware and behavioral model through selected and configured input/output interfaces.

The term configuration can be understood to include information about the data type, value range, resolution, and/or the units of a signal value, among other information. In addition, the term configuration is also to be understood to include signal widths, signal limit values, or also scaling adjustments of the signal, e.g. through linear or general mathematical functions or with the aid of lookup tables. In the event of inconsistencies in this regard between the hardware port and the associated model port, an adjustment, for instance typecasting, which is to say a conversion of the data type of a signal, by the input/output function may be necessary. The terms model port and hardware port are understood within the scope of the present invention to mean, e.g., inputs or outputs of configuration devices for a hardware component or a model, wherein the configuration devices can take the form of blocks of a configuration block diagram, for example.

With the complexity of today's embedded systems, the configuration of such a tester can extend to a number of input/output interfaces. In order to keep the hardware that is to be connected from being placed at risk by misconfiguration, for example by a maximum output voltage being exceeded because a data type was chosen incorrectly, measurement hardware is customarily used to measure and verify output values at the hardware pins after executing a simulation of the behavioral model. If an output value is not within the expected parameters, it is necessary to search for an incorrect configuration.

This method of measurement and adjustment of the configuration can thus only take place with the tester present, and moreover may require a number of simulation runs, which can involve a great expenditure of time.

SUMMARY OF THE INVENTION

It is therefore an object of the present invention to provide an improved method for configuring a test device.

In an exemplary embodiment, the present invention comprises a method for configuring an input/output interface that is present in a test device and that connects a hardware unit to a behavioral model present in a test device, wherein the method can include: displaying a graphical representation of the input/output interface as a signal path between a hardware port for connection of the hardware and at least one model port for connecting the behavioral model by means of a selectable input/output function; receiving a first configuration for the signal path; receiving a test value that is predefinable at the hardware port or the model port of the signal path, for example, predefinable through the graphical representation of the hardware port or the model port; propagating a test signal associated with the test value along the signal path according to the first configuration for the signal path; and displaying the propagated test signal, preferably displaying the propagated test signal on the graphical representation of the model port or the hardware port.

A tester or test device can be understood to include a device that permits signal transmission between a software model and an external hardware unit connected to the tester, e.g., a control unit.

The invention is based on the insight that an immediate verification of a signal path configuration for preparation of an HIL or RCP simulation avoids potential risk to the hardware to be connected, without the need to perform elaborate measurements with external measurement instrumentation in so doing. Furthermore, the invention makes it possible in complex applications to directly test even partial configurations, whereas with the conventional method the complete configuration must first be carried out—possibly by different persons—in order to then be able to measure the output values of the complete simulation at the I/O pins of the hardware in subsequent test runs. The invention thus allows a more flexible configuration of a test device for HIL simulators or for Rapid Prototyping, which can be verified with regard to its correctness even before the hardware to be connected, or the tester, is available. This permits efficient design of the various test phases for control units of all types.

After (partial) configuration of the test device, at least one, but also multiple, test values can be specified at any desired end of a signal path, which is to say at the hardware port or at the model port. For example, a voltage of 5V can be specified at the hardware port. According to an embodiment of the invention, this test signal can be propagated according to the predefined signal path configuration through the input/output function to the model port. The test signal obtained in this way can be displayed in a graphical representation at the model port. In this context, a test value can comprise not only numeric information, but also additional information such as the unit, the data type, or other information describing the numerical value in detail. The propagated test signal can be displayed at the graphical representation of the model port or the hardware port. Under certain conditions, however, it is also advantageous for the propagated test signal to be displayed at any desired locations on the signal path. In this way, it is possible to identify locations on the signal path at which an incorrect configuration could be present.

In an embodiment of the present invention, the configuration of the signal path can include a statement of a data type, a scaling of the input/output value, a conversion of the data type, a voltage/current range of a hardware channel associated with the input/output value, and/or a unit or a resolution of an input/output value at the model port and/or hardware port.

In another embodiment, the propagation can include a propagation into the driver and execution of the driver code.

In another embodiment of the present invention, the propagation comprises: automatic code generation from the behavioral model for an access point function according to the signal path configuration for accessing the test signal associated with the test value, automatic code generation for the input/output function according to the signal path configuration, and/or execution of the generated code starting from the test value, wherein the test signal associated with the test value is propagated according to the generated code, and writing of the propagated test signal into a defined memory.

Automatic code generation based on a graphical model is known in the model-assisted development of embedded systems. In this process, functionalities for specific units are defined and are each made available as graphical blocks. In addition, rules exist for how hardware-specific code should be generated for such blocks. This code depends on hardware-specific parameters, which can—if applicable—be loaded from libraries or else can be individually configurable. Moreover, access point functions are defined for the behavioral model, by means of which functions it is possible to communicate values to the simulation or from there to an external device. Code is generated for such an access point function according to the signal path configuration, and likewise for the selected input/output function. Next, the generated code is executed, wherein the test value serves as the starting point of the code execution and the test signal calculated from the test value is propagated along the signal path according to the generated code, including any data type conversions that may be necessary. In order to be available for analysis even after the simulation, the test signal propagated to the other end of the signal path is written into a defined memory, which is available even after execution of the code.

In another embodiment, the display of the propagated test signal comprises accessing the test signal in the defined memory and assigning the test signal to the corresponding port in the graphical representation of the signal path.

In another embodiment, the method further comprises activating a hardware simulation unit for receiving an input or output signal.

In addition, the execution of the generated code comprises: if the test value was specified at the model port, accessing the test value by means of the access point function, which transfers an appropriate test signal to the input/output function; processing of the test signal by the input/output function, and writing the test signal into a memory of the hardware simulation unit; and after the execution of the program code, display of the test signal located in the memory of the hardware simulation unit at the corresponding hardware port in the graphical representation of the input/output interface; or if the test value was specified at the hardware port, writing the test value into a memory of the hardware simulation unit, reading of the test value by the input/output function, which transfers the test value as a test signal to the access point function; conversion of the test signal by the access point function, wherein the access point function writes the converted test signal into a second memory; and after the execution of the program code, display of the test signal located in the second memory at the corresponding model port in the graphical representation of the input/output interface.

The hardware simulation unit simulates the I/O hardware (input/output hardware), which is driven by the input/output drivers in a manner analogous to the real hardware. This means that if the test signal is predefined at the model port, a test signal is transferred through the access point function to the input/output function, which writes the signal into a memory of the hardware simulation unit with any applicable adjustments of the data type or other quantities.

Conversely, if the test value is predefined at the hardware port, the test value can be read from a memory of the hardware simulation unit and is treated as if the test value was an input signal that was received through a contact of the I/O hardware. This means that the input/output function reads the test value from the memory and forwards it according to the signal path configuration to the access point function as an appropriate test signal. The access point function converts the test signal according to the signal configuration and writes it into another memory that can be accessed after execution of the code for purposes of analysis.

In another embodiment, the test value can be a time-varying signal, e.g., an oscillating voltage or a digital signal such as a TTL signal (Transistor-Transistor Logic signal), for example.

Another aspect of the invention relates to a device for configuring an input/output interface of a test device for connecting a hardware unit and a behavioral model. The device can have a display for displaying a graphical representation of the input/output interface as a signal path between a hardware port for connection of the hardware and at least one model port for connecting the behavioral model by means of a selectable input/output function; a controller for configuring the input/output interface; code generator for generating executable program code for an access point function defined in the behavioral model and for generating executable program code for the input/output function, wherein the code generation takes place according to the signal path configuration. The device can further comprise an input device, for example, a keyboard, for entering a test value at one of the hardware ports or model ports, and is designed to propagate a signal based on the test value and in accordance with the generated code along the signal path, and to output it at the opposite model port or hardware port through a graphical user interface.

Signal path configurations for test devices, such as are used in HIL simulations or in Rapid Prototyping, can be verified efficiently with the aid of the configuration device. Thus, the entry of selected test values permits verification of specific signal path configurations immediately after they are defined, without the need for a complete configuration of the entire test device or a complete simulation run of the behavioral model. In addition to the savings in time and effort, potential risk to the hardware to be connected can also be precluded in this way, since it is possible to verify in advance that no output signals can be output to the hardware that, as a result of misconfiguration, exceed a permissible voltage, for example.

In an embodiment of the device according to the invention, the configuration of the signal path includes a data type of an input/output value at the model port and/or hardware port and/or a conversion of the data type and/or a scaling of the input/output value and/or a voltage/current range of a hardware channel associated with the input/output value.

In another embodiment, the test value can be a time-varying signal, e.g., an oscillating voltage or a TTL signal (Transistor-Transistor Logic signal).

In another embodiment of the device according to the invention, the device additionally can comprise a hardware simulation unit that has a register for storing the test value or the propagated test signal. In this case, the register is used by the input/output function in exactly the same manner as the real register in the hardware to be connected.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
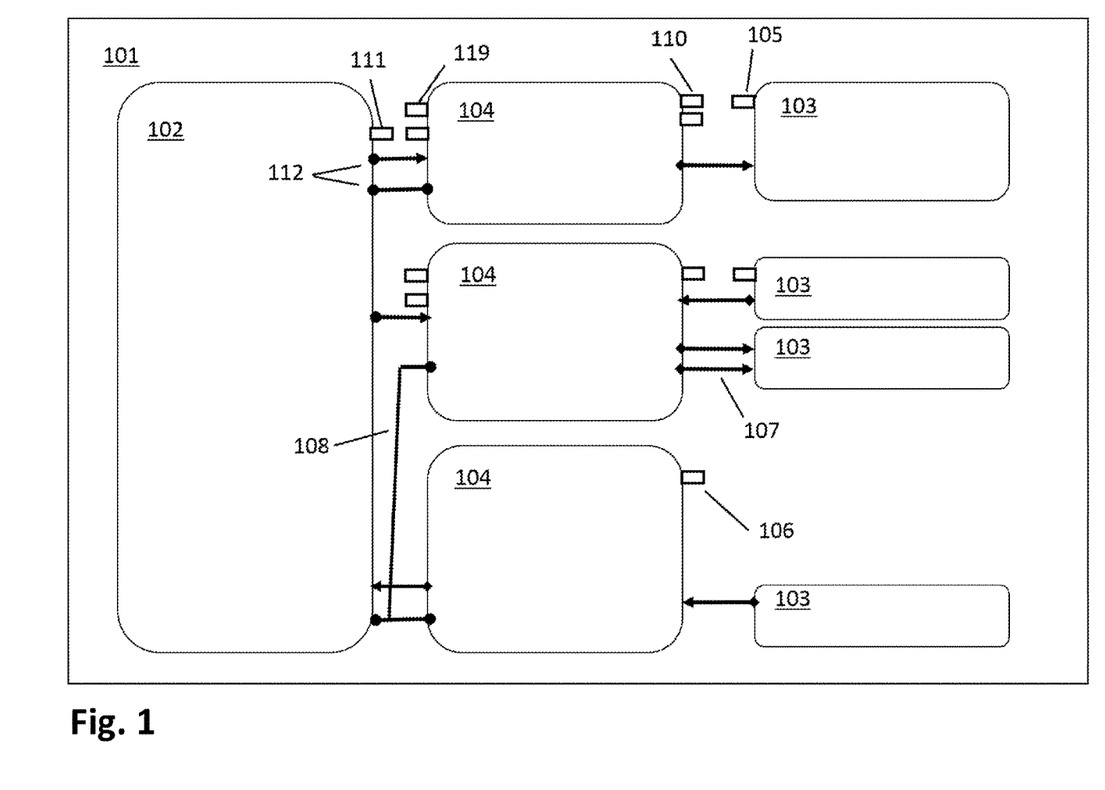
FIG. 1 is a graphical user interface according to an exemplary embodiment.

During configuration of a signal path for a test device of the type used in HIL simulations or in Rapid Prototyping, a graphical user interface such as is depicted in FIG. 1 is used to define signal paths between a hardware component 102, which with its input and output connectors 240 represents the hardware that is to be connected, and one or more behavioral model components 103. The hardware component can be a control unit to be tested, for example. The hardware terminals 240 are represented by hardware ports 111 in the graphical representation. The configuration device provides the option of performing a configuration of the hardware ports, for example specifying the (electrical) characteristics of the I/O hardware or the signal plugs/contacts of this external device, such as, e.g., a maximum current capacity or a resolution of, e.g., an analog-to-digital converter.

Located opposite the hardware component 102 are one or more behavioral model components 103, which have one or more model ports 105, which can likewise be provided with a specific configuration, for example the data type of a simulated signal, its resolution, etc. Depending on the configuration of a model port 105, an access point function corresponding to the selected configuration is generated during automatic code generation for the behavioral model.

To connect the hardware ports to the model ports, one or more input/output function components can be selected from a plurality of input/output function components 104 and placed between the hardware component 102 and the model component 103. In so doing, hardware ports 111 can be connected to input/output function ports 119 on the hardware side, with this being represented in the graphical user interface through connecting lines 112 between the ports. In like manner, input/output function ports 110 on the model side can be connected to model ports 105, which can likewise be accomplished through the placement of a connecting line 107 between the ports. In an HIL simulation or during RCP, the signal exchange between the hardware and the behavioral model then takes place along these defined and configured signal paths.

For the configuration components of the behavioral model as well as for the input/output function, it is possible, and frequently even necessary, to define specific configurations at the connecting ports. The appropriate input/output functions in accordance with the predefined configuration are generated during subsequent code generation for creation of executable program code for an HIL simulation or for RCP. Consequently it may be the case, for example, that a data type of an output signal of the behavioral model does not match the data type of an expected input value of the input/output function; for example, the behavioral model may output a floating-point value while the input/output function expects an integer. In this case it is necessary to perform data type conversion, which is specified by the configuration of the relevant ports. Scalings of the data values (including value range and resolution, among others) can also be configured. With the complexity of present-day embedded systems, the configuration can extend to a number of components whose configurations must be adjusted in each case.

Figure 2:
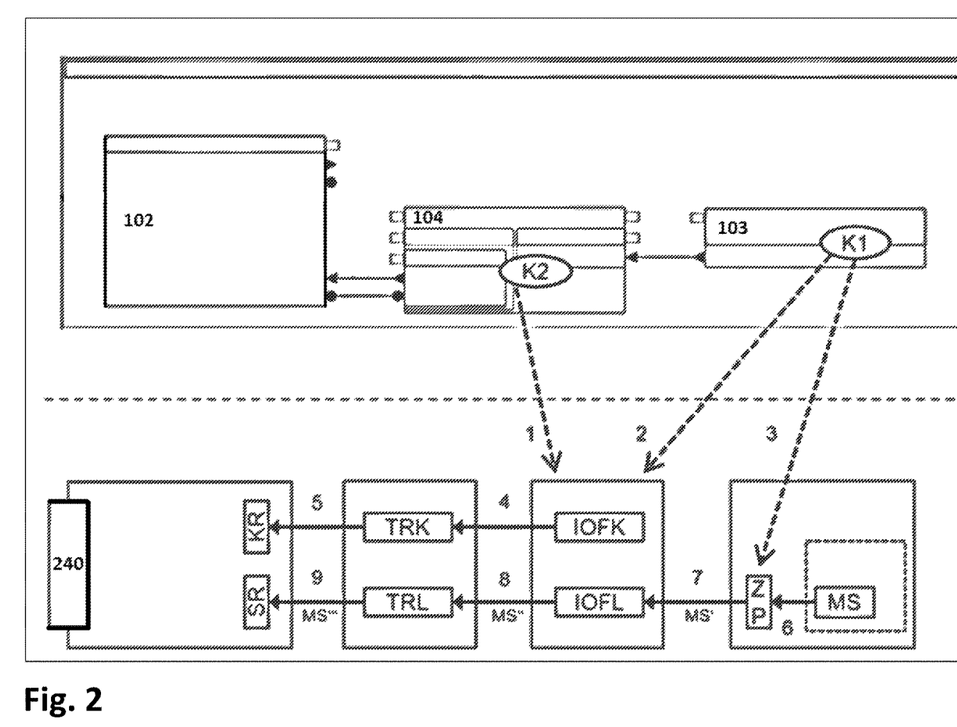
FIG. 2 illustrates a technical implementation of the signal path.

For an HIL simulation (and in an analogous manner for a simulation of a control unit in RCP), the technical implementation of the signal path takes place in the manner that is indicated in FIG. 2 using the example of an input/output function (e.g., output of a model signal through a digital output with TTL voltage levels). In simulation operation, which is to say with connected hardware and an integrated behavioral model, executable program code for the behavioral model is first generated for the integrated behavioral model by means of a model code generator. In addition, code is generated for the input/output function, including an input/output configuration function IOFK and an input/output run-time function IOFL, both of which are dependent on the configurations K1 of the model port 105 and K2 of the input/output function port.

During the initialization of a real-time application for an HIL simulation or during RCP, the input/output configuration function IOFK calls the input/output driver configuration function TRK with appropriate driver parameters to initialize the input/output driver according to the configuration K2 of the input/output function (4), e.g., to a voltage level of 0-5 volts. The input/output driver configuration function TRK writes the values corresponding to the driver parameters into one or more configuration registers KR of the hardware (5).

During the simulation operation in which the simulation tasks are triggered, which is to say during the run time of the generated real time application, a model signal is read (6) by an access point function generated in the model code. Since the access point function ZP was generated as a function of the configuration K1 of the model port, it performs any necessary conversions or data type conversions with regard to the model signal. The access point function ZP calls the input/output run-time function IOFL and in so doing passes it the (converted) model signal MS'. The input/output run-time function IOFL was generated as a function of the configurations K1 of the model port and K2 of the input/output function, so if applicable it carries out additional conversions or data type conversions with regard to the model signal. The input/output run-time function IOFL calls the input/output driver run time function TRL and in so doing passes it the (further converted) model signal MS" (8). The input/output driver run time function TRA converts the model signal MS" into the representation MS'" required for the write register or registers SR of the hardware and writes MS'" into the register or registers SR (9). Multiple registers SR may be involved in this process, e.g., one to set the value and another to activate the output of the newly set value. The hardware outputs the voltage level corresponding to the register content SR at the hardware plug 240.

If an error has occurred in the configuration K1 or K2, this can have the result that the voltage level at the plug exceeds a maximum value and damages connected hardware. In order to prevent this, the device for configuring the test device provides a test mode, such as is sketched in FIG. 3, and in which test signals can be specifically predefined at one end of the signal path and can be propagated along the signal path according to the predefined configuration. In this process, multiple conversions of the input signal, e.g., data type conversions (typecasting), may be necessary as a function of the configuration. The test signal or result signal thus obtained is read out at the other end of the signal path together with relevant configuration parameters and is displayed through the graphical user interface. In this way, a predefined configuration can be directly verified before simulation operation, without requiring additional devices or manually verifying the individual output signals.

Figure 3:
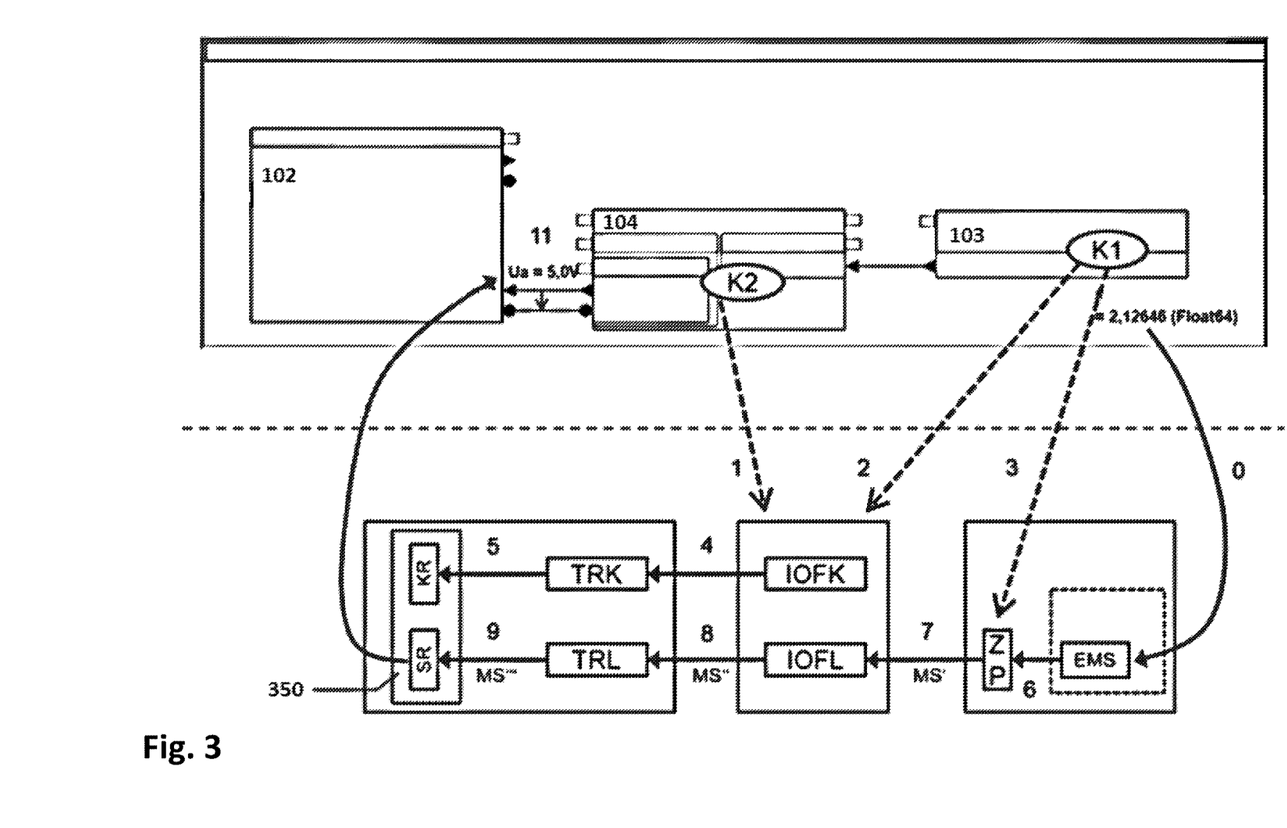
FIG. 3 illustrates a test mode of a test device according to an exemplary embodiment.

To this end, after configuration has been carried out of the relevant ports of any desired signal path, a test value is predefined in test mode at any desired port, e.g., a value for a model signal. Instead of the complete behavioral model, only a part of the model code is then generated, namely the model code that is required for processing the test value. Consequently, only code for a substitute model signal EMS is generated. The access point function ZP is generated as in the case of a complete simulation, based on the configuration K1 of the model port as always. The generation of the input/output functions, both as a function of the configurations K1 of the model port and K2 of the I/O function, also takes place in a manner analogous to simulation operation. In contrast to the simulation operation described above, a hardware simulation unit 350 that serves as the counterpart to the input/output driver functions TRK and TRL is activated or integrated in the input/output driver. This hardware simulation unit reproduces the behavior of the hardware to be connected. A simulated configuration register SKR and a simulated write register SSR are to be used in a manner identical to the real hardware from the point of view of the input/output driver functions TRK and TRL. The initialization of the test program takes place in a manner analogous to the initialization of the complete simulation program in simulation operation. During the run time of the test program, the test value predefined at any desired port is written to the appropriate memory location of the test program, and the test program is executed starting from this value.

When a test value is entered on the side of the model, the test value is written to the appropriate memory location of the appropriate model signal in the test program. As in simulation operation, access to this substitute model signal (EMS) takes place through the access point function ZP, which passes the test signal on through the input/output function, with necessary conversions or data type conversions as applicable. The input/output driver run time function TRL converts the model signal into the representation required for the simulated write register or registers SR of the hardware simulation unit 350, if applicable, and writes it into the simulated register or registers SR (9). Multiple simulated registers SR may be involved in this process, e.g., one to set the value and another to activate the output of the newly set value. The register entry thus obtained, generally a voltage level, is communicated to the test device, which is designed to display it at the corresponding port in the graphical user interface. In this way, a verification of the configuration can be carried out with the aid of the test device as early as during the configuration of a signal path, without the hardware to be connected to the test device being placed at risk and without extra equipment being required. Furthermore, even partial configurations can be verified without, e.g., having a complete behavioral model present, as is necessary for later simulation operation.

When a test value is entered on the hardware port side, a converse signal propagation takes place in a manner corresponding to the case of entry of a test value on the model side.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for configuring an input/output interface that is present in a test device and that connects a hardware unit to a behavioral model present in the test device, the method comprising:
    displaying a graphical representation of the input/output interface as a signal path between at least one hardware port for connecting the hardware unit and at least one model port for connecting the behavioral model via a selectable input/output function;
    receiving a first configuration for the signal path;
    receiving a test value that is predefinable at the hardware port or the at least one model port of the signal path or predefinable via the graphical representation of the at least one hardware port or the at least one model port;
    propagating a test signal associated with the test value along the signal path according to the first configuration for the signal path, said propagating the test signal comprising:
        automatically generating code from the behavioral model for an access point function according to the first configuration for the signal path for accessing the test signal associated with the test value; and
    displaying a propagated test signal or displaying the propagated test signal on the graphical representation of the at least one model port or the at least one hardware port.

2. The method according to claim 1, wherein the first configuration for the signal path comprises a data type of an input/output value at the at least one model port and/or the at least one hardware port, and/or a conversion of the data type, and/or a scaling of the input/output value, and/or a voltage/current range of a hardware channel associated with the input/output value.

3. The method according to claim 1, wherein said propagating the test signal further comprises:
    automatically generating the code for the selectable input/output function according to the first configuration of the signal path; and/or
    executing generated code starting from the test value, wherein the test signal associated with the test value is propagated according to the generated code, and writing of the propagated test signal into a defined memory.

4. The method according to claim 3, wherein said propagating further comprises a propagation of the test signal into a driver, and
    wherein the method further comprises executing the generated code associated with the driver.

5. The method according to claim 3, wherein outputting the signal comprises accessing a stored test signal and associating the stored test signal with an appropriate port in the graphical representation of the signal path.

6. The method according to claim 3, further comprising:
    activating a hardware simulation unit for receiving an input or output signal,
    wherein the execution of the generated code comprises:
        if the test value was specified at the at least one model port,
            accessing the test value by means of the access point function, which transfers an appropriate test signal to the input/output function;
            processing the test signal by the input/output function; and
            writing the test signal into a memory of a hardware simulation unit, and after the execution of the generated code, displaying the test signal located in the memory of the hardware simulation unit at a corresponding hardware port in the graphical representation of the input/output interface, or
        if the test value was specified at the at least one hardware port,
            writing the test value into the memory of the hardware simulation unit;
            reading the test value by the selectable input/output function, which transfers the test value to the access point function as the test signal;
            converting the test signal by the access point function, wherein the access point function writes a converted test signal into a second memory; and
            after the execution of the generated code, displaying the test signal located in the second memory at a corresponding model port in the graphical representation of the input/output interface.

7. The method according to claim 1, wherein the test value is a time-varying signal.

8. A device for configuring an input/output interface of a test device for connecting a hardware unit to a behavioral model, the device comprising:
    a display for displaying a graphical representation of the input/output interface as a signal path between at least one hardware port for connection of the hardware unit and at least one model port for connecting the behavioral model via a selectable input/output function;
    a controller for configuring the input/output interface;
    a code generator for generating executable program code for an access point function defined in the behavioral model and for generating the executable program code for the selectable input/output function, wherein code generation takes place according to a signal path configuration; and
    an input device for entering a test value at one end of the at least one hardware port or the at least one model port,
    wherein the device propagates a signal based on the test value and in accordance with generated code along the signal path and outputs the signal at an opposite end of the at least one model port or the at least one hardware port through a graphical user interface.

9. The device according to claim 8, wherein the signal path configuration comprises a data type of an input/output value at the at least one model port and/or the at least one hardware port and/or a conversion of the data type and/or a scaling of the input/output value and/or a voltage/current range of a hardware channel associated with the input/output value.

10. The device according to claim 8, wherein the test value is a time-varying signal.

11. The device according to claim 8, further comprising a hardware simulation unit that has a register for storing the test value or a propagated test signal.

12. The method according to claim 1, wherein the test device is a hardware-in-the-loop simulator or a rapid control prototyping system.

13. The method according to claim 1, wherein said displaying the propagated test signal further comprises displaying the propagated test signal at any desired locations on the signal path.

14. The method according to claim 1, further comprising:
    initializing an input/output driver with driver parameters according to a configuration of the selectable input/output function.

15. The method according to claim 14, wherein said initializing occurs during a hardware-in-the-loop simulation.

16. The method according to claim 14, wherein the input/output driver is initialized during an initialization of a real-time application for an hardware-in-the-loop simulation.

17. The device according to claim 8, wherein the test device is a hardware-in-the-loop simulator or a rapid control prototyping system.

* * * * *